US012640697B2

(12) United States Patent
Xu et al.

(10) Patent No.: US 12,640,697 B2
(45) Date of Patent: May 26, 2026

(54) OPERATIONAL AMPLIFIER

(71) Applicant: SG MICRO CORP, Beijing (CN)

(72) Inventors: Jing Xu, Beijing (CN); Xiang Yu, Beijing (CN)

(73) Assignee: SG MICRO CORP, Beijing (CN)

( * ) Notice: Subject to any disclaimer, the term of this patent is extended or adjusted under 35 U.S.C. 154(b) by 417 days.

(21) Appl. No.: 18/256,661

(22) PCT Filed: Oct. 21, 2021

(86) PCT No.: PCT/CN2021/125339
§ 371 (c)(1),
(2) Date: Jun. 9, 2023

(87) PCT Pub. No.: WO2022/121526
PCT Pub. Date: Jun. 16, 2022

(65) Prior Publication Data
US 2024/0039494 A1 Feb. 1, 2024

(30) Foreign Application Priority Data

Dec. 10, 2020 (CN) .......................... 202011451042.9

(51) Int. Cl.
*H03F 3/45* (2006.01)
*H03F 1/30* (2006.01)
(52) U.S. Cl.
CPC ......... *H03F 3/45183* (2013.01); *H03F 1/301* (2013.01); *H03F 3/45273* (2013.01); *H03F 2203/45528* (2013.01)
(58) Field of Classification Search
CPC .. H03F 3/45183; H03F 1/301; H03F 3/45273; H03F 2203/45528; H03F 1/52; H03F 3/45

(Continued)

(56) References Cited

U.S. PATENT DOCUMENTS 6,316,997 B1 * 11/2001 Tammone, Jr. ...... H03G 1/0029
330/254
6,483,683 B1 11/2002 Stenstrom
(Continued)

FOREIGN PATENT DOCUMENTS

CN 1355957 A 6/2002
CN 101553822 A 10/2009
(Continued)

OTHER PUBLICATIONS

International Search Report (including English translation) and Written Opinion for International Application No. PCT/CN2021/125339, dated Dec. 16, 2021, 8 pages.
(Continued)

*Primary Examiner* — Andrea Lindgren Baltzell
*Assistant Examiner* — Khiem D Nguyen
(74) *Attorney, Agent, or Firm* — Westman, Champlin & Koehler, P.A.

(57) ABSTRACT

Disclosed is an operational amplifier, including: a loading input transistor pair; a differential input transistor pair, which is connected with the loading input transistor pair, has a non-inverting input terminal receiving a non-inverting input signal, and has an inverting input terminal receiving an inverting input signal; a controller unit, generating a first control signal according to the non-inverting input signal and a second control signal according to the inverting input signal; a regulator unit, connected between the differential input transistor pair and ground, controlled by the first control signal and the second control signal, and select an on/off state of the regulator unit itself according to a voltage difference between the non-inverting and inverting input signals, which is withstood by a MOS transistor with high withstand voltage, thus allowing a source-drain voltage of (Continued)

300 the input transistor pair to be within a voltage range accepted by process.

10 Claims, 3 Drawing Sheets

(58) Field of Classification Search
USPC .......................................................... 330/253
See application file for complete search history.

(56) References Cited

U.S. PATENT DOCUMENTS

| | | | |
|---|---|---|---|
| 7,215,196 B2 * | 5/2007 | Banba | H03F 3/45183 |
| | | | 327/356 |
| 7,339,402 B2 | 3/2008 | Alenin et al. | |
| 7,554,364 B2 | 6/2009 | Alenin et al. | |
| 2007/0188191 A1 | 8/2007 | Alenin et al. | |
| 2008/0068081 A1 | 3/2008 | Alenin et al. | |
| 2014/0285256 A1 | 9/2014 | Mitsuishi et al. | |

FOREIGN PATENT DOCUMENTS

| | | |
|---|---|---|
| CN | 104065356 A | 9/2014 |
| CN | 114070213 A | 2/2022 |
| CN | 115514328 A | 12/2022 |
| WO | 2022121526 A1 | 6/2022 |

OTHER PUBLICATIONS

First Office Action, for Chinese Patent Application No. 202011451042.9, dated Nov. 14, 2022 8 pages.

* cited by examiner

VP

MP1    MP2

V+    MN1    MN2    V-

A

I0

VN

100

- prior art -

- prior art -

OPERATIONAL AMPLIFIER

CROSS-REFERENCE TO RELATED APPLICATION

The present application is a Section 371 National Stage application of International Application No. PCT/CN2021/125339, filed on Oct. 21, 2021, which published as WO 2022/121526 A1, on Jun. 16, 2022, not in English, and claims priority to Chinese patent application No. 202011451042.9, filed on Dec. 10, 2020, entitled "Operational Amplifier", the contents of which are incorporated herein by reference in their entireties.

FIELD OF THE DISCLOSURE

The present disclosure relates to a technical field of electronic circuits, in particular to an operational amplifier.

DESCRIPTION OF THE RELATED ART

OPA is an abbreviation of operational amplifier. In an actual circuit, a feedback network is usually combined with an OPA to form a module having a particular function. Operational amplifier was applied in analog computers in early days to realize mathematical operations, from which it got its name, and this name continues to this day. Operational amplifier is a circuit unit named from a functional point of view, and can be realized by a discrete device or in a semiconductor chip. With the development of semiconductor technology, most operational amplifiers now exist in a monolithic form of chip. Nowadays, there are many kinds of operational amplifiers, which are widely used in almost all industries.

Generally, an input terminal of an operational amplifier is not connected with any protection structure, which brings a disadvantage that in the circuit, if an input voltage difference of the operational amplifier is large, it may be difficult to handle a common terminal of an input transistor pair of the operational amplifier, as long as a source-drain voltage (VGS) corresponding to one of input terminals of the input transistor pair consisting of MOS (Metal Oxide Semiconductor) transistors exceeds a maximum voltage that can be withstood, the operational amplifier may be burned or operational amplifier performance may be changed.

As shown in FIG. 1, an operational amplifier 100 having an open-loop structure and an input transistor pair consisting of N-type MOS transistors is taken as an example here. VP and VN are represented as a power supply terminal and a virtual ground terminal of the operational amplifier, respectively. NMOS transistor MN1 and NMOS transistor MN2 are arranged as an input transistor pair. PMOS transistor MP1 and PMOS transistor MP2 are arranged as a loading transistor pair. (V+) and (V−) represent a non-inverting input voltage and an inverting input voltage, respectively. When a voltage difference between (V+) and (V−) is large, for example, when (V+) is 20V, (V−) is 2V, and VGS is 1V, a voltage VA at node A is VA=(V+)−VGS=20V−1V=19V, and at this time VGS (MN2)=(V−)−VA=2V−19V=−17V. Based on a general process, operating range of VGS of an MOS transistor is −5.5V~5.5V. Obviously, VGS of NMOS transistor MN2 exceeds process limit. MN2 may be damaged.

Based on this, a solution proposed by the prior art is to clamp gate of the input transistor pair, as shown in FIG. 2. An operational amplifier 200 having an open-loop structure and an input transistor pair consisting of N-type MOS transistors is given here as an example. VP and VN are a power supply terminal and a virtual ground terminal of the operational amplifier, respectively. NMOS transistor MN1 and NMOS transistor MN2 are arranged as an input transistor pair. PMOS transistor MP1 and PMOS transistor MP2 are arranged as a loading transistor pair. (V+) and (V−) represent a non-inverting input voltage and an inverting input voltage, respectively.

VINP and VINN are gate voltages of MN1 and MN2, respectively. Diode D1 and diode D2 are clamping diodes between VINP and VINN (VD1 is a turn-on voltage of diode D1, which is 0.6 V generally).

When a voltage difference between (V+) and V− is large, for example, when (V+)=20V and (V−)=2V, VINP>VINN, D1 is turned on, and VINN is clamped, so that VINN=VINP−VD1. Therefore, a voltage difference between VINP and VINN is 0.6 V, that is, VINP−VINN=0.6 V. At this time, a conductive path is formed from (V+) to (V−) through resistor R1, diode D1 and resistor R2, thus a current I0 flowing from (V+) to (V−) is generated:

$$I0=((V+)-(V-)-VD1)/(R1+R2)=0.87mA,$$

therefore, $VINP=(V+)-R1*I0=20V-10K*0.87mA=11.3V,$ based on this, it can be obtained that the voltage VA at node A can be VA=VINP-VGS=11.3V−1V=10.3V, and $VINN=VINP-0.6V=10.3V-0.6V=9.7V,$ therefore, VGS (MN2)=VINN−VA=9.7V−10.3V=−0.6V, so that the VGS of the input transistor pair will not exceed process limit.

However, in this solution, there will be a current flowing from (V+) to (V−). In some specific application scenarios, it is not expected to have a current flowing through (V+), so this solution according to the prior art cannot meet requirements of those application scenarios.

SUMMARY

In order to solve the above technical problems, an operational amplifier is provided according to embodiments of the present disclosure, and can allow a source-drain voltage of an input transistor pair included in the operational amplifier to be within a voltage range accepted by process, ensuring that an output voltage of the operational amplifier under normal conduction state is stabilized within a certain range, and improving stability of the operational amplifier.

According to embodiments of the present disclosure, an operational amplifier is provided, and comprises:

a loading input transistor pair;

a differential input transistor pair, connected with the loading input transistor pair, wherein a non-inverting input signal is applied to a non-inverting input terminal of the differential input transistor pair, and an inverting input signal is applied to an inverting input terminal of the differential input transistor pair;

a controller unit, configured to generate a first control signal according to the non-inverting input signal and a second control signal according to the inverting input signal;

a regulator unit, connected between the differential input transistor pair and ground, controlled by the first control signal and the second control signal, and configured to select an on/off state of the regulator unit itself according to a voltage difference between the non-inverting input signal and the inverting input signal.

In some embodiments, the loading input transistor pair comprises a first transistor and a second transistor, a first terminal of the first transistor and a first terminal of the second transistor are jointly connected to a power supply terminal of the operational amplifier, and a control terminal of the first transistor and a control terminal of the second transistor are jointly connected to a second terminal of the first transistor.

In some embodiments, the differential input transistor pair comprises a third transistor and a fourth transistor, the third transistor has a first terminal connected with the second terminal of the first transistor, a second terminal connected with the regulator unit, and a control terminal serving as the non-inverting input terminal for receiving the non-inverting input signal, the fourth transistor has a first terminal connected with a second terminal of the second transistor, a second terminal connected with the regulator unit, and a control terminal serving as the inverting input terminal for receiving the inverting input signal.

In some embodiments, the regulator unit comprises:

a fifth transistor and a sixth transistor connected in series between the second terminal of the third transistor and the second terminal of the fourth transistor, wherein a control terminal of the fifth transistor is configured to receive the first control signal, a control terminal of the sixth transistor is configured to receive the second control signal, and a connection node between the fifth transistor and the third transistor is a first node, a connection node between the fifth transistor and the sixth transistor is a second node, and a connection node between the sixth transistor and the fourth transistor is a third node.

In some embodiments, the regulator unit further comprises:

a first current source, which is connected between the first node and the ground and configured to provide a first current;

a second current source, which is connected between the second node and the ground and configured to provide a second current;

a third current source, which is connected between the third node and the ground and configured to provide a third current.

In some embodiments, any one of the first transistor, the second transistor, the third transistor, the fourth transistor, the fifth transistor and the sixth transistor is a metal oxide semiconductor field effect transistor.

In some embodiments, each of the first transistor and the second transistor is a P-type metal oxide semiconductor field effect transistor, and each of the third transistor, the fourth transistor, the fifth transistor and the sixth transistor is an N-type metal oxide semiconductor field effect transistor.

In some embodiments, each of the fifth transistor and the sixth transistor is a N-type metal oxide semiconductor field effect transistor with high withstand voltage.

In some embodiments, in response to the voltage difference between the non-inverting input signal and the inverting input signal being greater than a withstand voltage of the third transistor or the fourth transistor, both the fifth transistor and the sixth transistor are operated in turn-on state.

In some embodiments, the first control signal has a voltage which is numerically equal to a sum of a voltage of the non-inverting input signal and a preset voltage, and the second control signal has a voltage which is numerically equal to a sum of a voltage of the inverting input signal and the preset voltage, and the preset voltage is adjustable.

The present disclosure has following beneficial effects: the operational amplifier provided according to embodiments of the present disclosure comprises: a loading input transistor pair; a differential input transistor pair connected with the loading input transistor pair, wherein a non-inverting input signal is applied to a non-inverting input terminal of the differential input transistor pair, and an inverting input signal is applied to an inverting input terminal of the differential input transistor pair; a controller unit that generates a first control signal according to the non-inverting input signal, and a second control signal according to the inverting input signal; a regulator unit, which is connected between the differential input transistor pair and ground, controlled by the first control signal and the second control signal, and is configured to select an on/off state of the regulator unit itself according to a voltage difference between the non-inverting input signal and the inverting input signal. The voltage difference between the non-inverting input signal and the inverting input signal is transferred to the regulator unit and is withstood by MOS transistors (the fifth transistor and the sixth transistor) with high withstand voltage, thus allowing a source-drain voltage of the input transistor pair included in the operational amplifier to be within a voltage range accepted by process, ensuring that an output voltage of the operational amplifier under normal conduction state can be stabilized within a certain range, and improving stability of the operational amplifier.

BRIEF DESCRIPTION OF THE DRAWINGS

The above and other objects, features and advantages of the present invention will become more apparent from the following description of embodiments of the present disclosure with reference to the accompanying drawings.

DETAILED DESCRIPTION OF EMBODIMENTS OF THE DISCLOSURE

Figure 1:
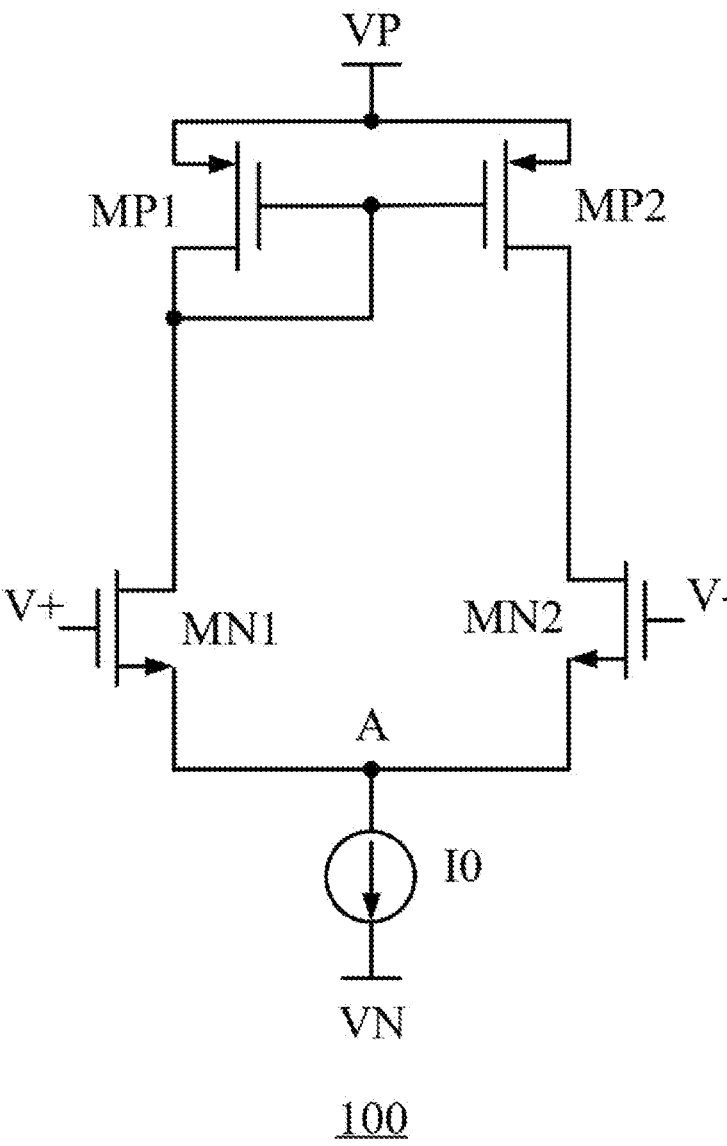
FIG. 1 shows a circuit structure diagram of a basic operational amplifier according to the prior art.
Figure 2:
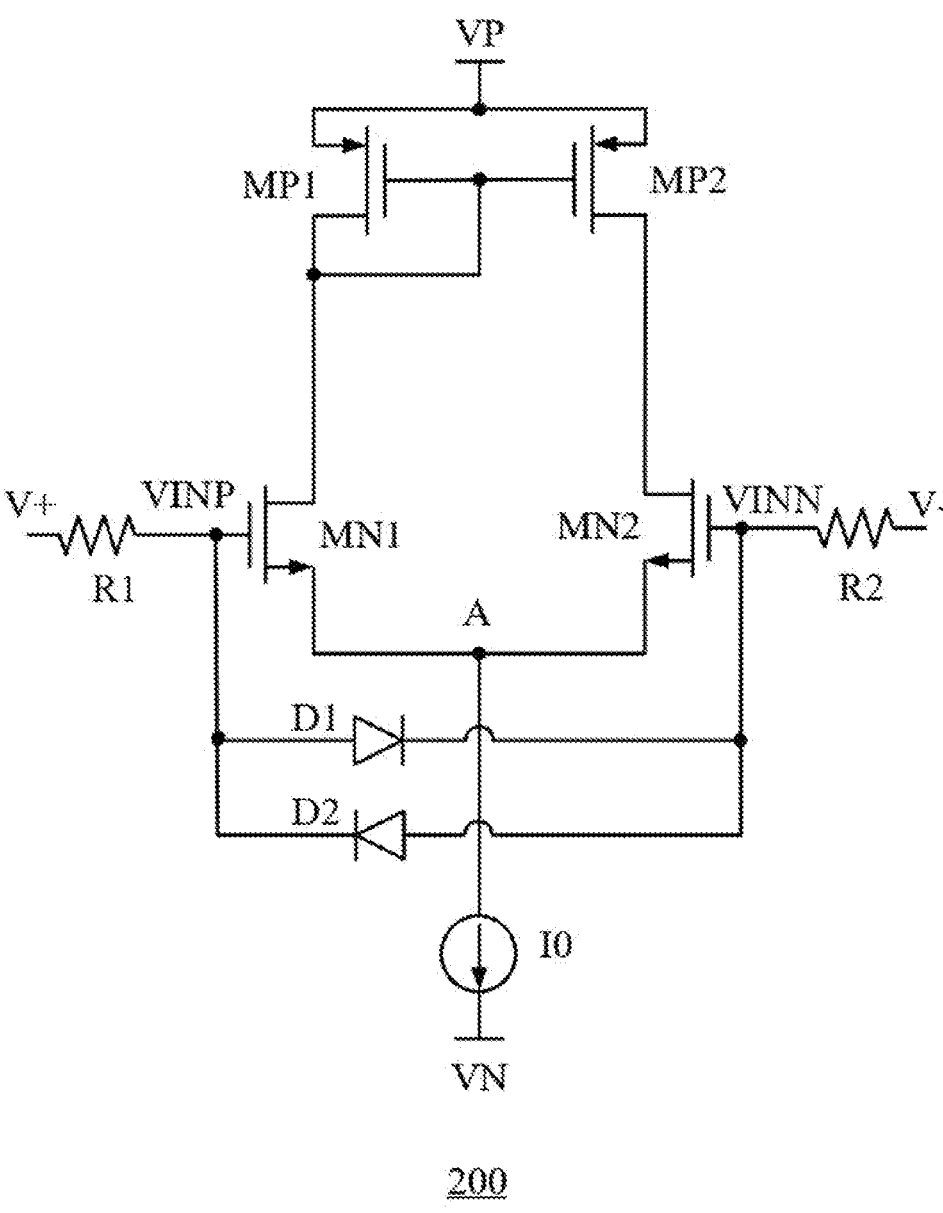
FIG. 2 shows a circuit structure diagram of another operational amplifier according to the prior art.

For making the present disclosure easily understood, a more complete description of the present disclosure is provided below with reference to the associated drawings. Some preferred embodiments of the present disclosure are shown in the drawings. However, the present disclosure may be implemented in different forms and is not limited to the embodiments described herein. These embodiments are provided for making the present disclosure more thoroughly and fully understood. Unless otherwise defined, all technical and scientific terms used herein have the same meaning as would normally be understood by those skilled in the art of the present disclosure. Terms used herein in the specification of the present disclosure are for an objective to describe specific embodiments only and are not intended to limit the present invention.

Hereinafter, embodiments of the present disclosure will be described in detail with reference to the accompanying drawings.

Figure 3:
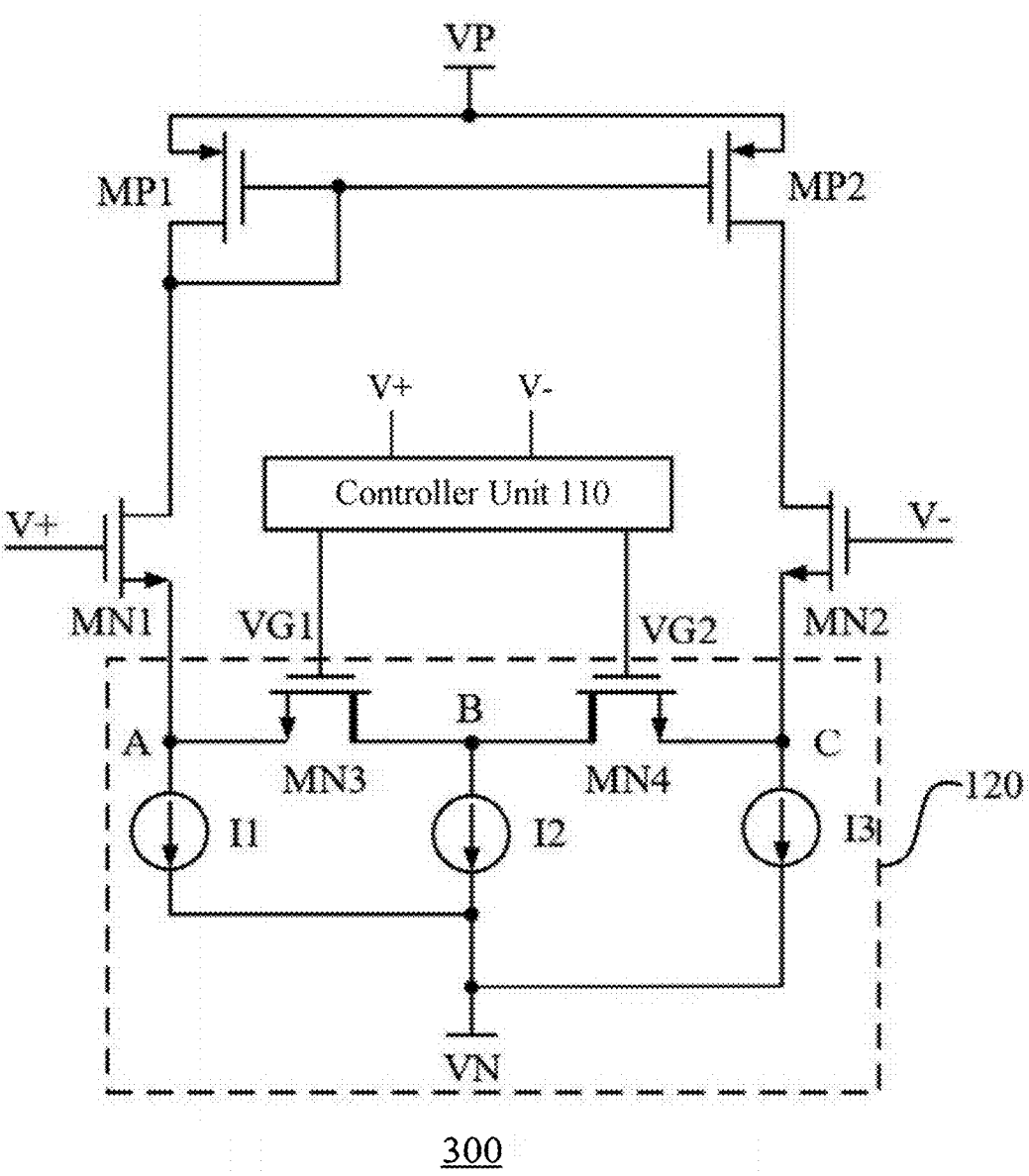
FIG. 3 shows a circuit structure diagram of an operational amplifier provided according to an embodiment of the present disclosure.

FIG. 3 shows a circuit structure diagram of an operational amplifier provided according to an embodiment of the present disclosure.

Referring to FIG. 3, according to an embodiment of the present disclosure, an operational amplifier 300 is provided, wherein VP is a power supply terminal of the operational amplifier 300, VN is a virtual ground terminal of the operational amplifier 300, and (V+) and (V−) represent a non-inverting input voltage (hereinafter referred to as a non-inverting input signal) and an inverting input voltage (hereinafter referred to as an inverting input signal), respectively. The operational amplification 300 at least includes:

a loading input transistor pair;

a differential input transistor pair, which is connected to the loading input transistor pair, wherein the non-inverting input signal (V+) is applied to a non-inverting input terminal of the differential input transistor pair, and the inverting input signal (V−) is applied to an inverting input terminal of the differential input transistor pair;

a controller unit 110, configured to generate a first control signal VG1 according to the non-inverting input signal (V+) and a second control signal VG2 according to the inverting input signal (V−); and a regulator unit 120, which is connected between the differential input transistor pair and ground, controlled by the first control signal and the second control signal, and configured to select an on/off state of the regulator unit itself according to a voltage difference between the non-inverting input signal and the inverting input signal.

Further, the loading input transistor pair comprises a first transistor MP1 and a second transistor MP2, wherein a first terminal of the first transistor MP1 and a first terminal of the second transistor MP2 are jointly connected to the power supply terminal VP of the operational amplifier 300, and a control terminal of the first transistor MP1 and a control terminal of the second transistor MP2 are jointly connected to a second terminal of the first transistor MP1.

Further, the differential input transistor pair comprises a third transistor MN1 and a fourth transistor MN2, wherein a first terminal of the third transistor MN1 is connected to the second terminal of the first transistor MP1, a second terminal of the third transistor MN1 is connected to the regulator unit 120, a control terminal of the third transistor MN1 serves as the non-inverting input terminal of the operational amplifier to receive the non-inverting input signal (V+), a first terminal of the fourth transistor MN2 is connected to a second terminal of the second transistor MP2, a second terminal of the fourth transistor MN2 is connected to the regulator unit 120, and a control terminal of the fourth transistor MN2 serves as the inverting input terminal to receive the inverting input signal (V−).

Further, the regulator unit 120 comprises a fifth transistor MN3 and a sixth transistor MN4 connected in series between the second terminal of the third transistor MN1 and the second terminal of the fourth transistor MN2, wherein a control terminal of the fifth transistor MN3 receives the first control signal VG1, a control terminal of the sixth transistor MN4 receives the second control signal VG2, and a connection node between the fifth transistor MN3 and the third transistor MN1 is a first node A, a connection node between the fifth transistor MN3 and the sixth transistor MN4 is a second node B, and a connection node between the sixth transistor MN4 and the fourth transistor MN2 is a third node C.

Further, the regulator unit 120 further comprises:

a first current source, connected between the first node A and the virtual ground terminal VN for providing a first current I1; a second current source connected between the second node B and the virtual ground terminal VN for providing a second current I2; a third current source connected between the third node C and the virtual ground terminal VN for supplying a third current I3.

Further, any one of the first transistor MP1, the second transistor MP2, the third transistor MN1, the fourth transistor MN2, the fifth transistor MN3, and the sixth transistor MN4 is a metal oxide semiconductor field effect transistor (MOS transistor for short).

Further, in this embodiment, each of the first transistor MP1 and the second transistor MP2 is a P-type MOS transistor, and each of the third transistor MN1, the fourth transistor MN2, the fifth transistor MN3 and the sixth transistor MN4 is an N-type MOS transistor.

Further, in this embodiment, each of the fifth transistor MN3 and the sixth transistor MN4 is an N-type MOS transistor with high withstand voltage.

Further, in the controller unit 110, the first control signal VG1 serves as a gate voltage of the fifth transistor MN3, and has a voltage which is numerically equal to a sum of a voltage of the non-inverting input signal (V+) and a preset voltage $\Delta V$; and the second control signal VG2 serves as a gate voltage of the sixth transistor MN4, and has a voltage which is numerically equal to a sum of the inverting input signal (V−) and the preset voltage $\Delta V$, and the preset voltage $\Delta V$ is adjustable.

In an actual application, the preset voltage $\Delta V$ can be adjusted according to an operating voltage range of an actual operational amplifier and a turn-on voltage of the third transistor MN1 and the fourth transistor MN2 which constitute the differential input transistor pair.

Further, in the operational amplifier 300, in response to the voltage difference between the non-inverting input signal (V+) and the inverting input signal (V−) being larger than a withstand voltage (VDS) of the third transistor MN1 or the fourth transistor MN2, the fifth transistor MN3 and the sixth transistor MN4 are both in turn-on state, the voltage difference is withstood by the fifth transistor MN3 and the sixth transistor MN4 with high withstand voltage, thereby ensuring that VGS of the third transistor MN1 and the fourth transistor MN2 in the differential input transistor pair is within a voltage range accepted by process, and operational characteristics of the operational amplifier 300 can be normal.

In an embodiment, for example, the threshold voltages of the third transistor MN1 and the fourth transistor MN2 are both Vth, and the threshold voltages of the fifth transistor MN3 and the sixth transistor MN4 are both Vth_H.

In a first implementation scenario, the non-inverting input signal (V+) is 20V, the inverting input signal (V−) is 2V, the preset voltage $\Delta V$ is 2V, Vth=1V, and Vth_H=2V, then the voltage VA at the first node A is VA=(V+)−Vth=19V, the gate voltage of the fifth transistor MN3 is VG1=(V+)+$\Delta V$=20V+2V=22V, the gate-source voltage of the fifth transistor MN3 is $$VGS(MN3)=VG1-VA=22V-19V=3V>Vth\_H,$$

therefore, the fifth transistor MN3 is in turn-on state, so VB=VA=19V.

The gate voltage of the sixth transistor MN4 is VG2=(V−)+$\Delta V$=2V+2V=4V, the voltage VC at the third node C is VC=VG2−Vth_H=4V−2V=2V, the gate-source voltage of the fourth transistor MN2 is VGS (MN2)=(V−)−VC=2V−2V=0V, which does not exceed its process limit.

At this time, the source-drain voltage of the sixth transistor MN4 is $$VDS(MN4)=VB-VC=19V-2V=17V,$$

A high voltage portion of the voltage difference between the non-inverting input signal (V+) and the inverting input signal (V−) is withstood by the sixth transistor MN4 having high withstand voltage. And since the gate-source voltage of the fourth transistor MN2 is VGS=0V, the fourth transistor MN2 is in turn-off state and the third transistor MN1, the fifth transistor MN3 and the sixth transistor MN4 are all in turn-on state, so that the first current I1, the second current I2 and the third current I3 all flow through the third transistor MN1. At this time, operational characteristics of the operational amplifier 300 are consistent with those of normal operational amplifiers.

In a second implementation scenario, where the non-inverting input signal (V+) is 2V, the inverting input signal (V−) is 20V, the preset voltage ΔV is 2V, Vth=1V, and Vth_H=2V, based on a principle similar to the first implementation scenario, it can be obtained that, in the second implementation scenario, the third transistor MN1 is in turn-off state, and the fourth transistor MN2, the fifth transistor MN3 and the sixth transistor MN4 are in turn-on state. Therefore, the first current I1, the second current I2 and the third current I3 all flow through the fourth transistor MN2. At this time, operational characteristics of the operational amplifier 300 are also consistent with those of normal operational amplifiers.

In a third implementation scenario, when both the non-inverting input signal (V+) and the inverting input signal (V−) are 2V, the preset voltage ΔV is 2V, Vth=1V, and Vth_H=2V, then the voltage VA at the first node A is VA=(V+)−Vth=1V,
the gate voltage of the fifth transistor MN3 is VG1=(V+)+ΔV=2V+2V=4V,
the gate-source voltage of the fifth transistor MN3 is $$VGS(MN3)=VG1-VA=4V-1V=3V>Vth\_H,$$

therefore, the fifth transistor MN3 is in turn-on state, so VB=VA=1V.
The gate voltage of the sixth transistor MN4 is VG2=(V−)+ΔV=2V+2V=4V,
the gate-drain voltage of the sixth transistor MN4 is $$VGD(MN4)=VG2-VB=4V-1V=3V>Vth\_H,$$

therefore, the sixth transistor MN4 is also in turn-on state, so VC=VB=1V.
The gate-source voltage of the fourth transistor MN2 is VGS (MN2)=(V−)−VC=2V−1V=1V,
therefore, the fourth transistor MN2 is also in turn-on state, and at this time
the gate-source voltage of the third transistor MN1 is VGS (MN1)=VGS (MN2),
therefore, the first current I1, the second current I2, and the third current I3 each flow through the third transistor MN1 and the fourth transistor MN2 evenly. At this time, operational characteristics of the operational amplifier 300 are also consistent with those of normal operational amplifiers.

To sum up, an operational amplifier 300 provided according to embodiments of the present disclosure includes: a loading input transistor pair; a differential input transistor pair connected with the loading input transistor pair, wherein a non-inverting input signal is applied to a non-inverting input terminal of the differential input transistor pair, and an inverting input signal is applied to an inverting input terminal of the differential input transistor pair; a controller unit 110, configured to generate a first control signal VG1 according to the non-inverting input signal (V+) and a second control signal VG2 according to the inverting input signal (V−); and a regulator unit 120, which is connected between the differential input transistor pair and ground, controlled by the first control signal VG1 and the second control signal VG2, and configured to select an on/off state of the regulator unit itself according to a voltage difference between the non-inverting input signal (V+) and the inverting input signal (V−). When there is a large voltage difference between the gate voltages of the third transistor MN1 and the fourth transistor MN2 which constitute the differential input transistor pair, the operational amplifier 300 can selectively transfer the voltage difference to the regulator unit 120 to make the voltage difference withstood by the high-voltage MOS transistors (the fifth transistor MN3 and the sixth transistor MN4), thereby allowing the source-drain voltage of the input transistor pair included in the operational amplifier 300 to be within a voltage range accepted by process, ensuring that the output voltage of the operational amplifier 300 under normal conduction state can be stabilized within a certain range, and improving stability of the operational amplifier 300.

It should be noted that, in the description of the present disclosure, it should be understood that terms "up", "down", "inside" and the like denote an orientation or positional relationship for ease and simplification of describing the present disclosure only, and are not intended to indicate or imply that the referenced component or element must have a particular orientation, or be constructed and operate in a particular orientation, therefore cannot be construed as limiting to the present disclosure.

Moreover, in the present disclosure, terms "including", "comprising" or any other variation thereof are intended to encompass non-exclusive inclusion, so that a process, method, article or equipment including a set of elements, may not only include those elements, but may also include other elements that are not explicitly listed, or may further include elements inherent to such process, method, article or equipment. In the absence of more limitations, an element limited by a statement "comprises a . . . " does not preclude an existence of another identical element in the process, method, article or equipment including said element.

Finally, it should be noted that, it is obvious that the embodiments in accordance with the present disclosure are described above, and these embodiments neither exhaustively describe all the details nor limit the present disclosure to only specific embodiments. Other variations or modifications in different forms may be made on the basis of the above description for those of ordinary skill in the art. Providing an exhaustive list of all embodiments here is not necessary and is also impossible. However, obvious variations or modifications derived therefrom are still within the protection scope of the present disclosure.

What is claimed is:

1. An operational amplifier, comprising:
a loading input transistor pair;
a differential input transistor pair, connected with the loading input transistor pair, wherein a non-inverting input signal is applied to a non-inverting input terminal of the differential input transistor pair, and an inverting input signal is applied to an inverting input terminal of the differential input transistor pair;
a controller unit, configured to generate a first control signal according to the non-inverting input signal and a second control signal according to the inverting input signal, the first control signal having a voltage which is numerically equal to a sum of a voltage of the non-inverting input signal and a preset voltage, and the second control signal having a voltage which is numerically equal to a sum of a voltage of the inverting input signal and the preset voltage;

a regulator unit, which is connected between the differential input transistor pair and ground, controlled by the first control signal and the second control signal, and configured to select an on/off state of the regulator unit itself according to a voltage difference between the non-inverting input signal and the inverting input signal.

2. The operational amplifier according to claim 1, wherein the loading input transistor pair comprises a first transistor and a second transistor, a first terminal of the first transistor and a first terminal of the second transistor are jointly connected to a power supply terminal of the operational amplifier, and a control terminal of the first transistor and a control terminal of the second transistor are jointly connected to a second terminal of the first transistor.

3. The operational amplifier according to claim 2, wherein the differential input transistor pair comprises a third transistor and a fourth transistor, a first terminal of the third transistor is connected with the second terminal of the first transistor, a second terminal of the third transistor is connected with the regulator unit, a control terminal of the third transistor serves as the non-phase input terminal for receiving the non-inverting input signal, a first terminal of the fourth transistor is connected with a second terminal of the second transistor, a second terminal of the fourth transistor is connected with the regulator unit, and a control terminal of the fourth transistor serves as the inverting input terminal for receiving the inverting input signal.

4. The operational amplifier according to claim 3, wherein the regulator unit comprises:

a fifth transistor and a sixth transistor connected in series between a second terminal of the third transistor and a second terminal of the fourth transistor, the first control signal is applied to a control terminal of the fifth transistor, the second control signal is applied to a control terminal of the sixth transistor, and a connection node between the fifth transistor and the third transistor is a first node, a connection node between the fifth transistor and the sixth transistor is a second node, and a connection node between the sixth transistor and the fourth transistor is a third node.

5. The operational amplifier according to claim 4, wherein the regulator unit further comprises:

a first current source, which is connected between the first node and the ground, and configured to provide a first current;

a second current source, which is connected between the second node and the ground, and configured to provide a second current;

a third current source, which is connected between the third node and the ground, and configured to provide a third current.

6. The operational amplifier according to claim 5, wherein any one of the first transistor, the second transistor, the third transistor, the fourth transistor, the fifth transistor, and the sixth transistor is a metal oxide semiconductor field effect transistor.

7. The operational amplifier according to claim 6, wherein each of the first transistor and the second transistor is a P-type metal oxide semiconductor field effect transistor, and each of the third transistor, the fourth transistor, the fifth transistor and the sixth transistor is an N-type metal oxide semiconductor field effect transistor.

8. The operational amplifier according to claim 7, wherein each of the fifth transistor and the sixth transistor is an N-type metal oxide semiconductor field effect transistor with high withstand voltage.

9. The operational amplifier according to claim 8, wherein in response to the voltage difference between the non-inverting input signal and the inverting input signal being greater than a withstand voltage of the third transistor or the fourth transistor, both the fifth transistor and the sixth transistor are operated in turn-on state.

10. The operational amplifier according to claim 9, wherein the preset voltage is adjustable.

* * * * *